United States Patent
Schulman et al.

Patent Number: 5,902,397
Date of Patent: May 11, 1999

[54] CRYSTAL HOLDER

[75] Inventors: Winfried Schulman, Kleinostheim; Helmut Kaiser, Bruchköbel; Franz Thimm, Alzenau, all of Germany

[73] Assignee: Leybold Systems GmbH, Germany

[21] Appl. No.: 08/864,031

[22] Filed: May 27, 1997

[30] Foreign Application Priority Data

May 30, 1996 [DE] Germany ............................ 196 21 695
May 28, 1996 [DE] Germany ............................ 196 21 350

[51] Int. Cl.$^6$ .................................................. C30B 35/00
[52] U.S. Cl. ............................................ 117/200; 117/911
[58] Field of Search .................................. 117/200, 208, 117/218, 911

[56] References Cited

U.S. PATENT DOCUMENTS

| | | | |
|---|---|---|---|
| 4,190,630 | 2/1980 | Apilat et al. | 117/911 |
| 5,126,113 | 6/1992 | Yamagishi et al. | 117/911 |
| 5,173,270 | 12/1992 | Kida et al. | 117/911 |
| 5,176,490 | 1/1993 | Ibe | 117/218 |

FOREIGN PATENT DOCUMENTS

| | | | |
|---|---|---|---|
| 369626 | 10/1989 | European Pat. Off. | C30B 15/32 |
| 449260 | 3/1991 | European Pat. Off. | C30B 15/30 |
| 002733896A1 | 2/1979 | Germany | 117/911 |

OTHER PUBLICATIONS

JP 4–321583 A., In: Patents Abstracts of Japan, C–1041, Mar. 29, 1993, vol. 17, No. 158.

*Primary Examiner*—Felisa Hiteshew
*Attorney, Agent, or Firm*—Fulbright & Jaworski, LLP.

[57] ABSTRACT

In an apparatus for the production of single crystals (103) by the Czochralski melt drawing method, a gripping device (125a, 125b) is provided, by means of which the crystal (103) is held during the growing process by a pressure which is exerted radially on its lateral surface and which exceeds the frictional resistance, as a result of which the weight of the growing crystal is completely supported. The gripping device (125a, 125b) has at least two holding devices (128a, 128b) arranged opposite each other, which, during the crystal growth phase, initially move parallel to the crystal and then, after a certain desired crystal diameter has been reached, are laid against the crystal by means of the holding devices (128a, 128b) in such a way that the growth the crystal in the area of the melting zone is not disturbed.

4 Claims, 11 Drawing Sheets

CRYSTAL HOLDER

BACKGROUND OF THE INVENTION

The invention pertains to a crystal holding device for use during the process of growing crystals by the Czochralski drawing method.

Apparatuses for growing single crystals by means of the Czochralski method are known. In apparatuses of this type, the crystal to be grown starts out as a seed crystal immersed in a melt and is grown either by lowering the melt bath or by raising the seed crystal up out of the melt. The single crystals drawn in this way out of a melt of silicon, for example, form the starting material for the production of so-called "wafers".

By means of the known apparatuses, it is has been possible over the course of recent years, through continuous improvements to the growing process and to the apparatuses used for this purpose, to increase the weights of the crystals to as much as 300 kg. It has turned out to be extremely difficult to increase the diameter of the single crystals produced by the Czochralski method. A basic reason for this is that, upon conclusion of the drawing process, the entire weight of the crystal is held by the seed crystal, which, because of the nature of the process, has a diameter of only 4–5 mm. It is necessary, however, to prevent the crystal from breaking off from the seed crystal and from thus destroying the crystal drawing apparatus. But because the tensile stress to which a seed crystal can be subjected cannot exceed a certain maximum value, only crystals of limited dimensions with a limited maximum weight can be produced in the known crystal drawing apparatuses.

Another problem which occurs during the drawing process is that, because the crystal is rotated as it grows, notch stress builds up in the seed crystal, which further reduces the maximum amount of load which the single crystal can be allowed to exert on the seed crystal. To guarantee a reliable growth process, in which the crystal is prevented from breaking off from the seed crystal, the process parameters during the drawing process are necessarily chosen in such a way that the tensile stress acting on the seed crystal remains significantly below the maximum allowable tensile stress.

The known crystal growing apparatuses thus suffer from the significant disadvantage that total weight and thus the crystal volume of the crystals which can be produced are limited. This disadvantage limits the economy of production by means of the known crystal drawing apparatuses.

The task of the present invention consists in making available an apparatus by means of which crystals can be produced by the Czochralski method in such a way that the crystal volume or crystal weight can be greater than the maximum weight determined by the amount of the tensile stress which can be exerted on the seed crystal.

SUMMARY OF THE INVENTION

This task is accomplished in accordance with the invention in that, after the crystal body has reached a certain length, it is supported by gripping devices which press against its peripheral surface and thus absorb some or all of the continuously increasing weight load of the crystal. As a result, it is advantageously guaranteed that the maximum amount of tensile stress which can act on the seed crystal is reduced to the value which can be allowed; and even when the total weight of the crystal exceeds the maximum value which can be allowed in accordance with the known methods, the crystal is still prevented from breaking off from the seed crystal. As an advantageous result of these measures according to the invention, crystals with diameters of >300 mm or even 400 mm at lengths of more than 2 m or with crystal weights of >300 kg can be produced. As a result of the invention, therefore, the economy of the production of single crystals is considerably increased.

So that the crystal can be gripped during the drawing process, a holding device is provided, which, after the crystal has reached certain length, exerts a force on the crystal body which is oriented exclusively in the radial direction. After a shoulder has been grown on the neck of the crystal, the crystal is grown with an essentially constant diameter over its entire length. As a result of the holding devices, which rest on the circumference of the crystal and which are preferably arranged in diametrically opposing pairs, it is impossible for a radially oriented force component to push the crystal out of its axial drawing direction or for the growth of the crystal to be disturbed by a change in the process parameters prevailing in the solidification region between the melt and the crystal. It is also provided that the holding devices rotate concentrically and in the same direction as the rotational movement of the single crystal, the holding devices according to the invention and the single crystal having the same angular velocity. In this way it is advantageously guaranteed that, while the holding devices are pressed against the crystal, the crystal is protected from the effects of any tangential force or torque which could disadvantageously affect the location of the crystal with respect to the melt bath and thus interfere with the growth of the single crystal.

Additional advantageous features according to the invention are stated in the subclaims.

The invention can be embodied in various ways, which are explained in greater detail below on the basis of especially advantageous exemplary embodiments illustrated in the figures.

BRIEF DESCRIPTION OF THE FIGURES

FIG. 3b shows a cross-sectional view along line A-A' of FIG. 3a;

Figures 1, 2:
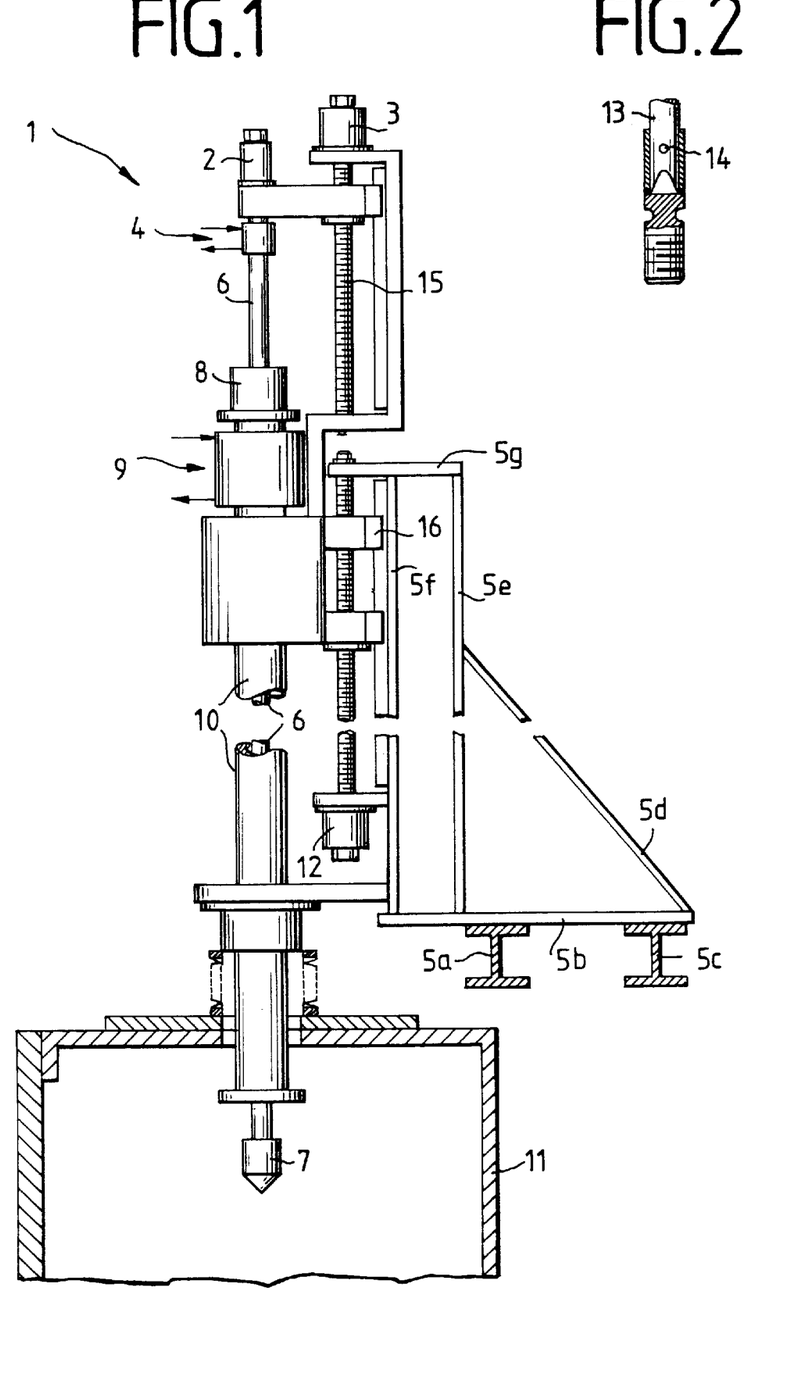
FIG. 1 shows a schematic diagram of a crystal drawing apparatus according to a first exemplary embodiment.
FIG. 2 shows a detailed cross section along line B-B' shown in FIG. 1.

In the case of the crystal drawing apparatuses shown in FIGS. 1–6, holding devices of various designs are provided, in which a crystal 27, 36, 50, is held suspended from a shaft 6, 25, 40, 45, 54. The crystal holder device illustrated in FIG. 1 consists essentially of two lifting mechanisms, an upper lifting mechanism 15, and a lower lifting mechanism 16, which can be operated independently of each other by two lifting motors an upper lifting motor 3, and a lower lifting motor 12. The crystal, drawn from a melt not shown in FIG. 1, is grown on seed crystal 7 as it is raised up from the melt under rotation of a shaft 6 by a torque motor 2. As soon as a defined minimum length is reached, the crystal (not shown in FIG. 1) is held in a frictional manner by a holding device; this holding device is rotated by a torque motor 8 by way of a shaft 10, which is coaxial to drawing shaft 6. To guarantee the smoothest possible transfer of the weight of the crystal from drawing shaft 6 to the holding device installed on shaft 10, means are provided by means of which the relative axial velocity of the upper and lower lifting mechanisms 15, 16 can be adjusted either by way of an open-loop or a closed-loop control circuit to a minimum value, preferably so that there is no relative motion at all. After the weight of the crystal has been transferred from upper lifting mechanism 15 to lower lifting mechanism 16, which drives the holding device in the axial direction, the crystal is held exclusively by the holding device, which locks onto the crystal by friction. Upper and lower lifting mechanisms 15, 16 are held permanently in position by means of a stand 5b, 5c, 5d, 5e, 5f.

Figure 3A:
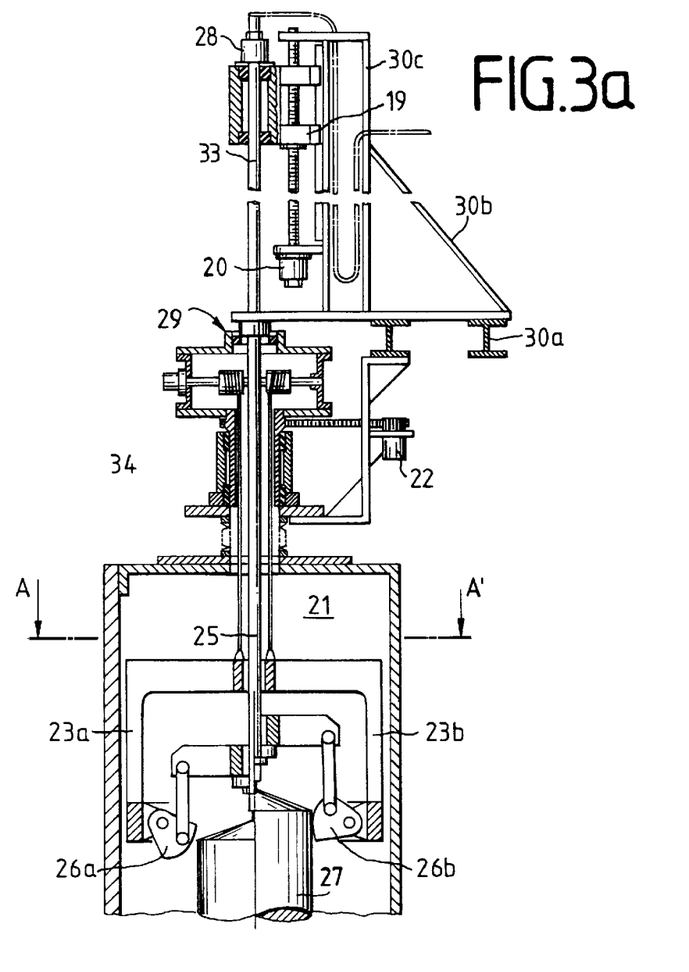
FIG. 3a shows a crystal drawing apparatus with a crystal holder according to the invention in accordance with a second exemplary embodiment.
Figure 3B:
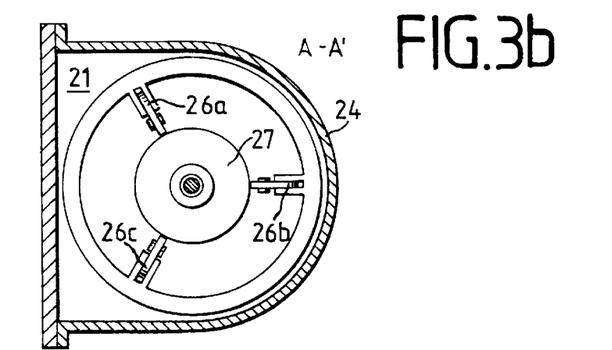

In the case of the exemplary embodiment shown in FIG. 3a, first lifting mechanism 19 is driven by lifting motor 20, by means of which drawing shaft 33 can be moved together with suspended crystal 27 in the axial direction. Drawing shaft 33 is rotated by means of torque motor 28, coupled to the shaft. Another torque motor 22 is provided to rotate the holding device with its gripping arms 23a, 23b and clamping jaws 26a, 26b, 26c in drawing space 21 in the same direction as that in which drawing shaft 33 is rotating. The first lifting mechanism is supported on a stand 30a, 30b, 30c in the form of a platform and carries the weight of the crystal at the beginning of the drawing process. After a certain minimum length has been reached, lifting mechanism 34 takes over the job of supporting the weight of the crystal until crystal 27 is fully formed. FIG. 3b shows a cross section of the apparatus along line A-A' shown in FIG. 3a.

Figure 4:
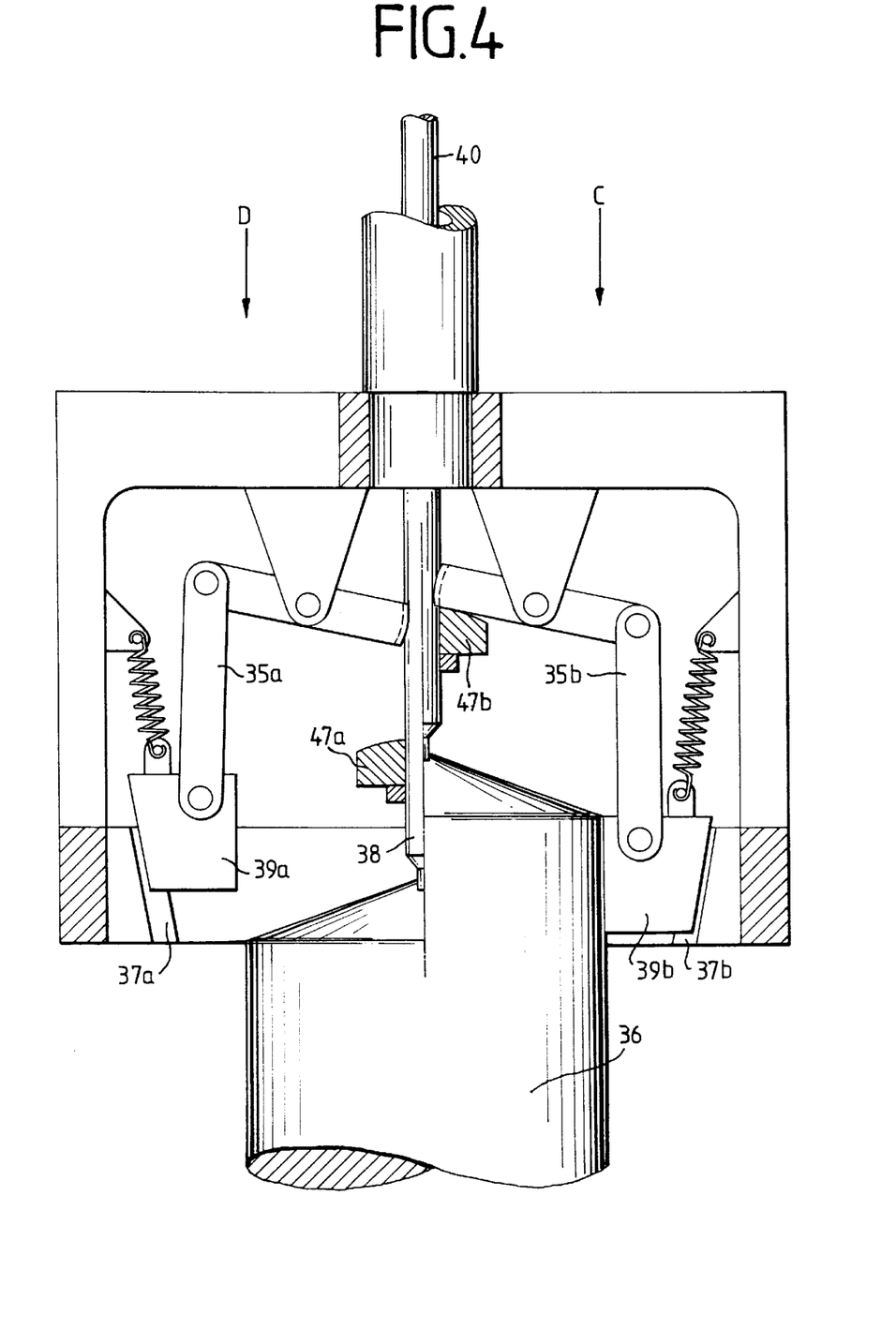
FIG. 4 shows a crystal drawing apparatus with a crystal holder according to another exemplary embodiment in two different crystal drawing positions.

FIG. 4 shows the crystal holding device installed in the drawing space in relation to a grown crystal 36 in two different positions C and D. The holding device consists essentially of ramps 37a, 37b, . . . , arranged concentrically and permanently in space with respect to the circumferential surface of the crystal; the associated holding jaws 39a, 39b, . . . , are mounted in such as way that they can slide along the ramps. Holding jaws 39a, 39b . . . , are pressed by means of spring bars 35a, 35b, . . . , which are driven by the upward motion of carriers 47a, 47b, mounted on the drawing shaft, against the ramp surfaces of ramps 37a, 37b, . . . , on the one hand and against crystal 36 shown in position C on the other. Crystal 36 is held firmly in position with respect to the holding device by the frictional clamping action of holding jaws 39a, 39b, 39c, . . . ; the holding device, which is moved upward in the axial direction, thus takes over the function of the drawing shaft, namely, to guarantee the uniform upward motion of crystal 36.

Figure 5:
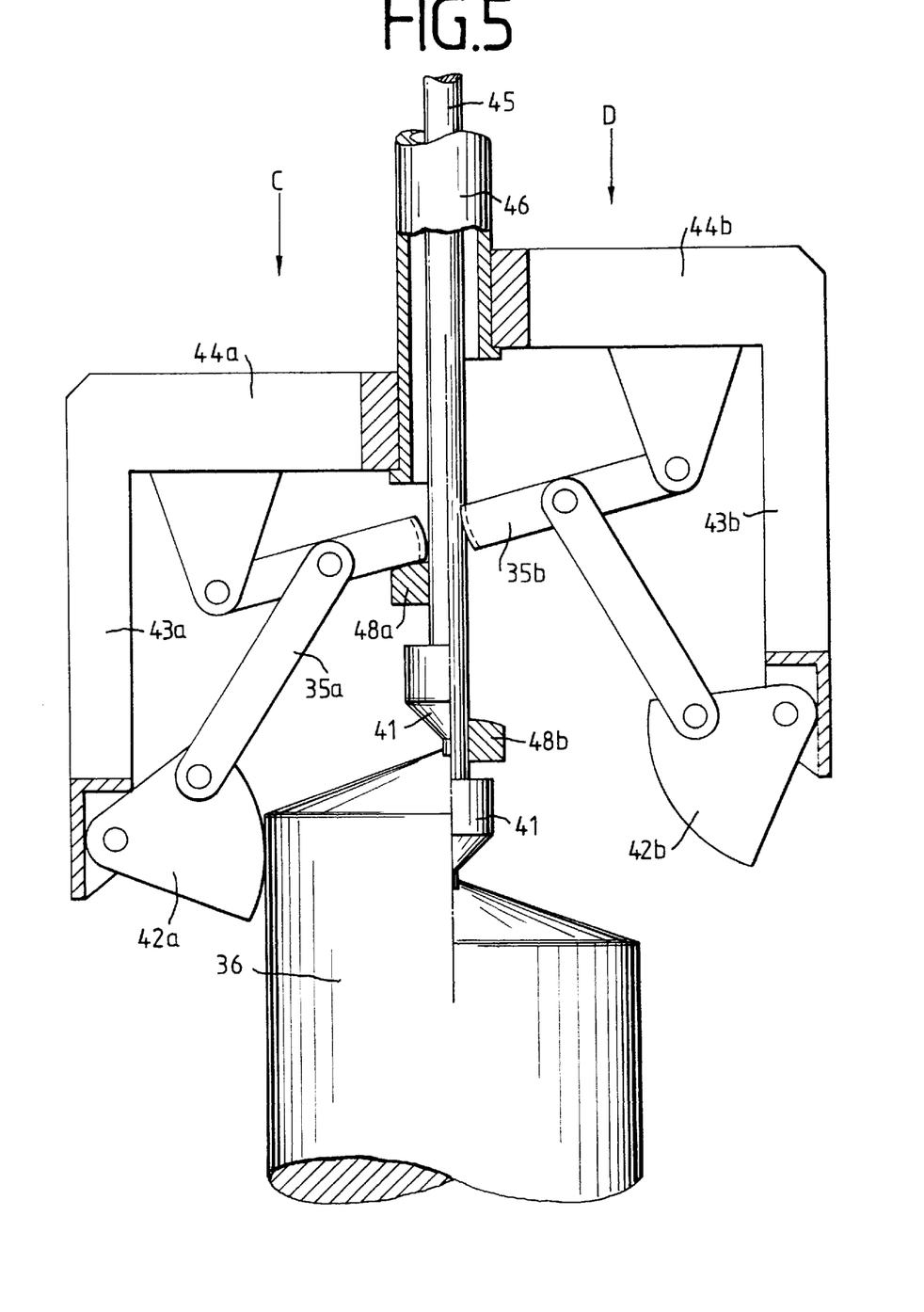
FIG. 5 shows a schematic diagram of a crystal holder according to another exemplary embodiment in two different crystal positions.

The crystal holding device shown in FIG. 5 is shown in two different positions relative to crystal 36, only part of which is shown. In position D, crystal 36 is in the initial drawing position, suspended from seed crystal 41, which is mounted on drawing shaft 45 and rotates uniformly with it. After a certain minimum length (see position C) has been reached, the circumference of crystal 36 is gripped laterally by several holding jaws 42a, 42b, 42c . . . arranged at intervals around the circumference of the crystal. Holding jaws 42a, 42b, 42c, . . . have a constant curvature with a constant radius or a continuously increasing or decreasing curvature with decreasing and increasing radii. Holding jaws 42a, 42b, 42c, . . . with their holding surfaces curved in this way are attached rotatably at one end to straps 43a, 43b, which are connected to support arms 44a, 44b attached to shaft 46, and connected at the other end to movable spring bars 35a, 35b, which are connected at the other end to shaft 46. Spring bars 35a, 35b, 35c . . . are brought into holding position C by wedges 48a, 48b, permanently mounted on shaft 46; these wedges comes into contact with spring bars 35a, 35b, 35c, . . . when the shaft is lifted in the axial direction. As a result, the contact surfaces of holding jaws 42a, 42b, 42c, . . . are pressed against the circumferential surface of the crystal in a frictional manner, as a result of which the entire weight of the crystal is held by support arms 44a, 44b, 44c, . . . acting by way of straps 43a, 43b, 43c, . . .

Figure 6:
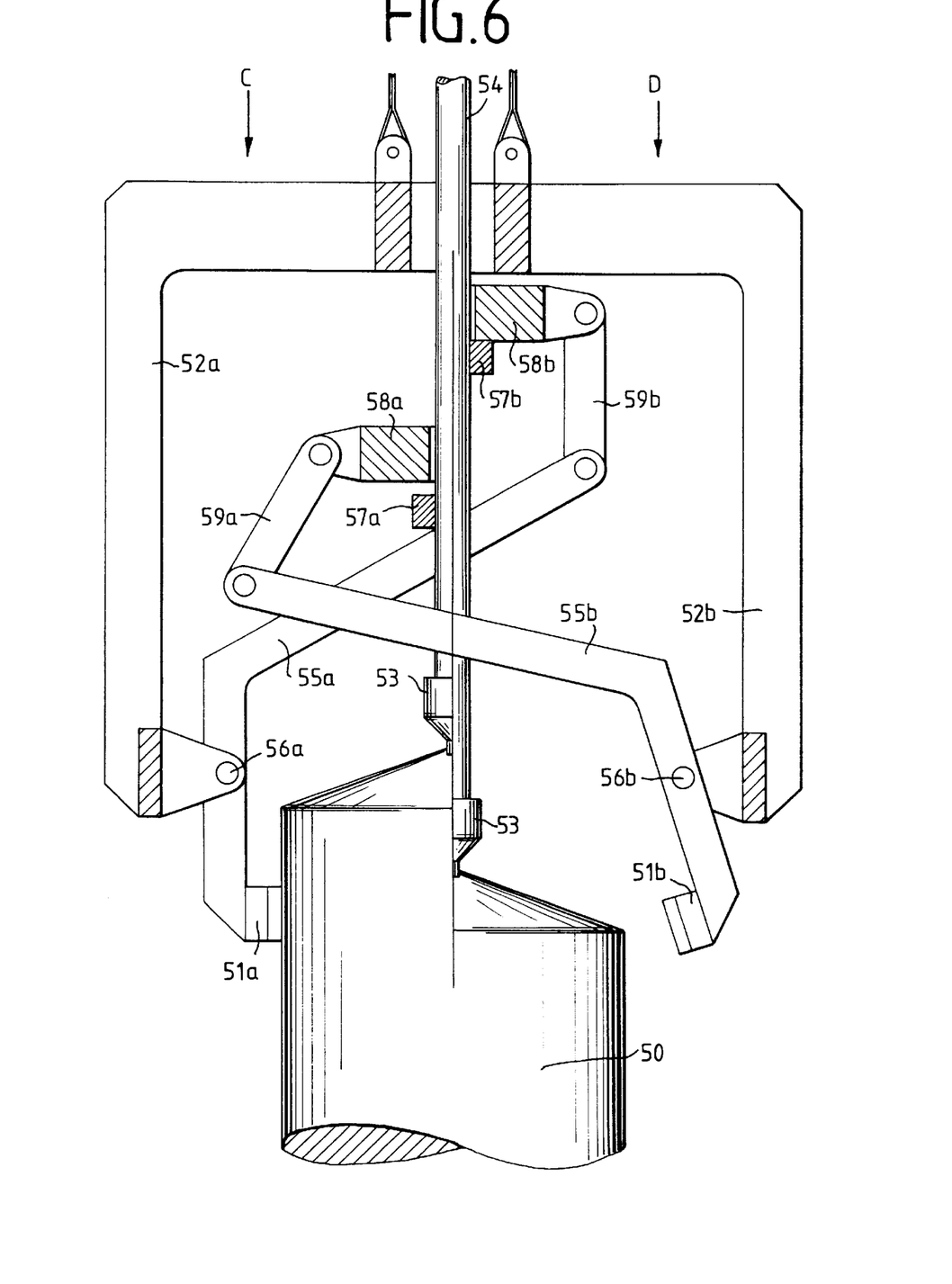
FIG. 6 shows a schematic diagram of a crystal holder according to a fifth exemplary embodiment in two different crystal holding positions.

The crystal holding device shown in FIG. 6 consists of strap arms 52a, 52b, concentric to the drawing shaft, and scissors arms 55a, 55b, which are connected to the strap arms by means of pivot bearings 56a, 56b. At the other end, scissors arms 55a, 55b are attached by way of intermediate members 59a, 59b to hangers 58a, 58b. Hangers 58a, 58b are pushed upward parallel to the drawing direction by carriers 57a, 57b during the upward motion of crystal 50 hanging from seed crystal 53. As a result, a stretching motion is exerted on intermediate members 59a, 59b, as a result of which clamping jaws 51a, 51b, which are adjacent to the circumferential surface of the crystal and which are attached to scissors arm 55a, 55b, are pressed against the lateral surface of the crystal in a preferably concentric manner. After carriers 57a, 57b have been moved a defined distance, crystal 50 is gripped in a frictional manner by clamping jaws 51a, 51b, . . . , as a result of which seed crystal 53 is relieved of some or all of the weight of the crystal, as it increases during the growth process.

In the crystal drawing apparatuses illustrated in FIGS. 7–13, gripping devices of different designs are provided, by means of which crystal 103, which is suspended from a drawing cable 110 by way of seed crystal 115, can be held securely after the crystal has grown to a certain minimum length. Each exemplary embodiment shows a different type of gripping device for holding crystal 103. This gripping device serves to provide additional holding security for crystal 103; and, in the exemplary embodiment shown in FIGS. 7 and 8, it hangs together with a second drum 102b in a transfer lock 118, where two winches are located side by side. These are of identical design except that the first one has two drums on one axle. After release springs 109a, 109b; 124a, 124b; 132a, 132b; 152a, 152b; 164a, 164b have been released, depending on how the gripping device is designed, the weight of the crystal is carried by cables 11a, 11b.

Depending on how the control system is designed, the load can also be suspended from three cables (not shown in the figures), in which case the stretching of the cables must be taken into account.

Figure 7:
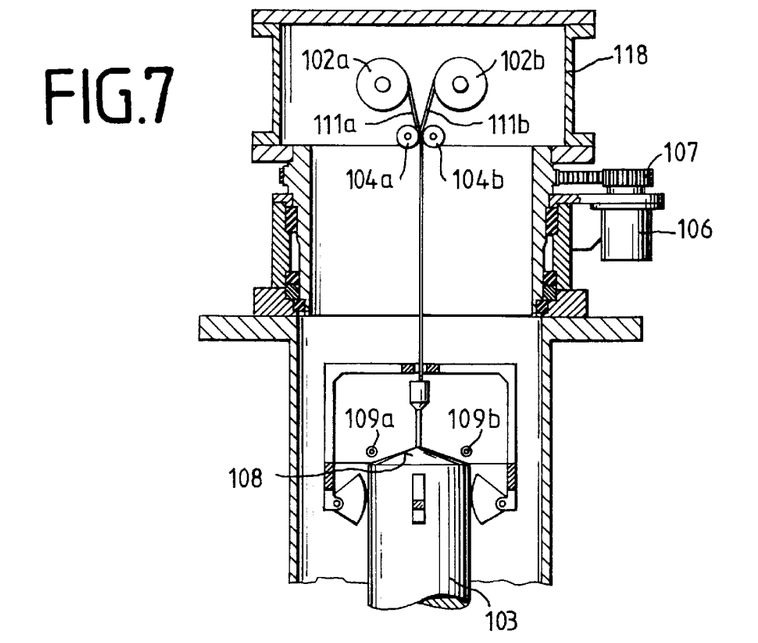
FIG. 7 shows a schematic diagram of a crystal drawing apparatus according to a sixth exemplary embodiment.
Figure 8:
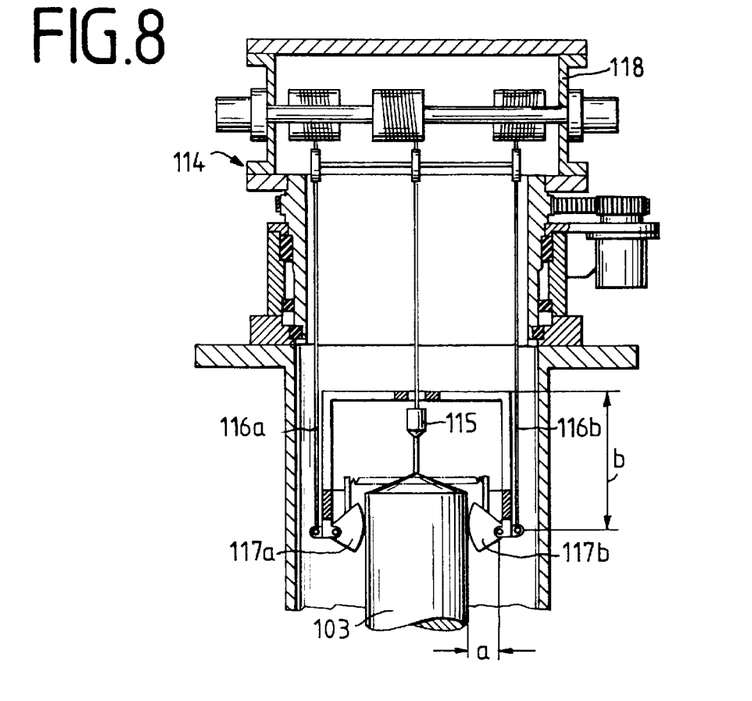
FIG. 8 shows an enlarged portion of the crystal drawing apparatus shown in FIG. 7.

According to the first exemplary embodiment shown in FIGS. 7 and 8, crystal 103 moves against release springs 109a, 109b, which are bent by the intrinsic weight of the gripper, and whereby the force pressing on it cancels out the stabilization of the gripper in its empty state. The gripper is held by two cables 116a, 116b attached to holding jaws 117a, 117b. Jaws 117a, 117b of the pair pivot and make contact with crystal 103. The rotation of the crystal is thus not interrupted. Crystal 103 is held by way of leverage a/b and the frictional connection between crystal 103 and holding jaws 117a, 17b. Depending on the selected leverage a/b, very large holding forces can be generated. To minimize the point load on the crystal, several jaws can also be arranged one above the other on the circumference of the crystal. Because the lifting mechanisms are all mounted on a single rotating table 114, and because the lifting mechanisms are actuated independently of each other, the gripper can be coupled in a defined manner to holding jaws 117a, 117b without subjecting crystal 103 to any jerky interactions.

Figure 9:
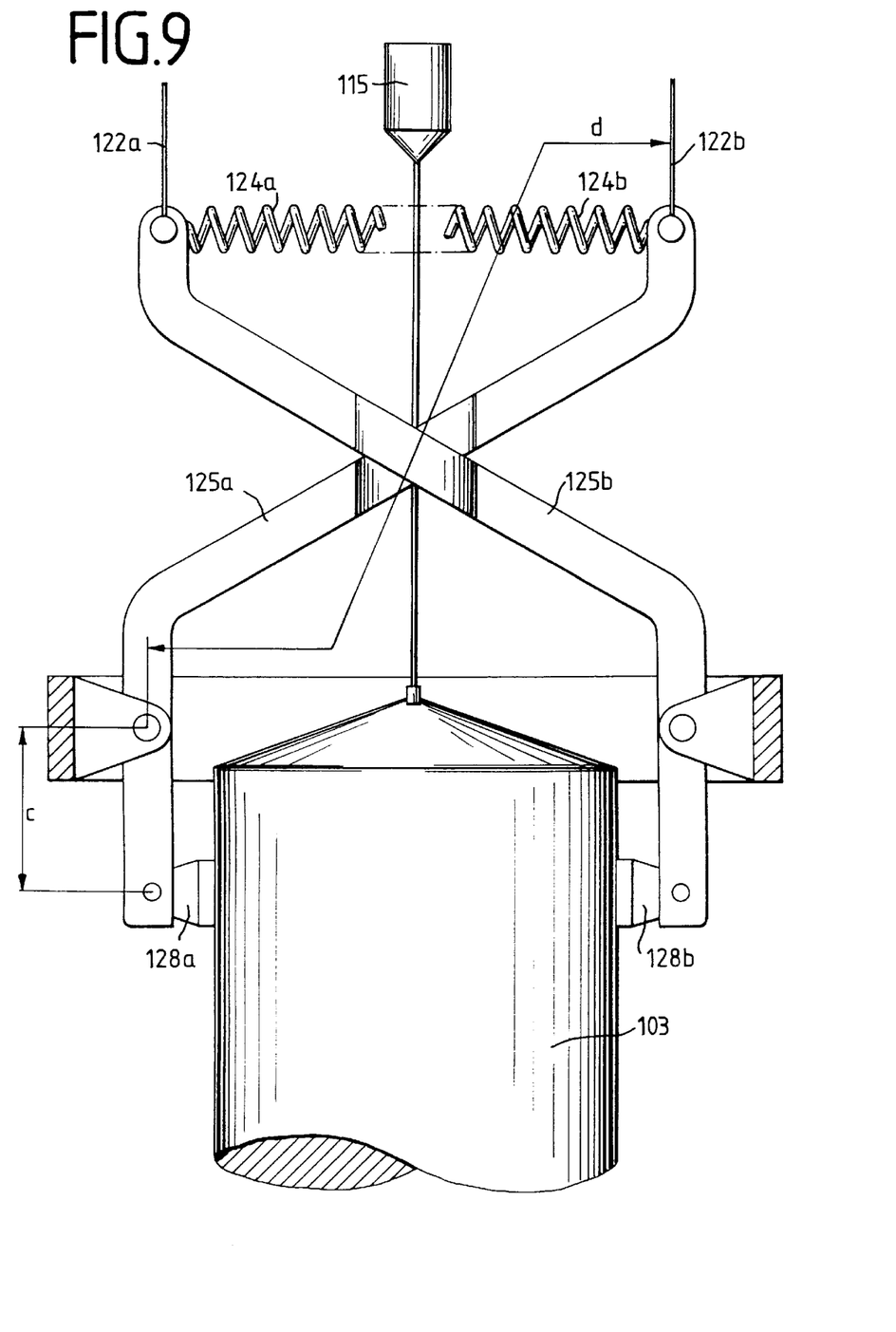
FIG. 9 shows a crystal drawing apparatus with a crystal container according to a seventh exemplary embodiment.

According to the exemplary embodiment shown in FIG. 9, it is provided that the pressure applied by holding jaws 128a, 128b, is adjusted for leverage c/d. Holding jaws 128a, 128b can be present either as a pair or as multiples of pairs, and after they are resting on the lateral surface of the crystal they can generate a pressure over an area sufficient to stabilize crystal 103. The gripper is held by two cables, 122a, 122b. Scissor arms 125a, 125b are attached to holding jaws 128a, 128b.

Figure 10:
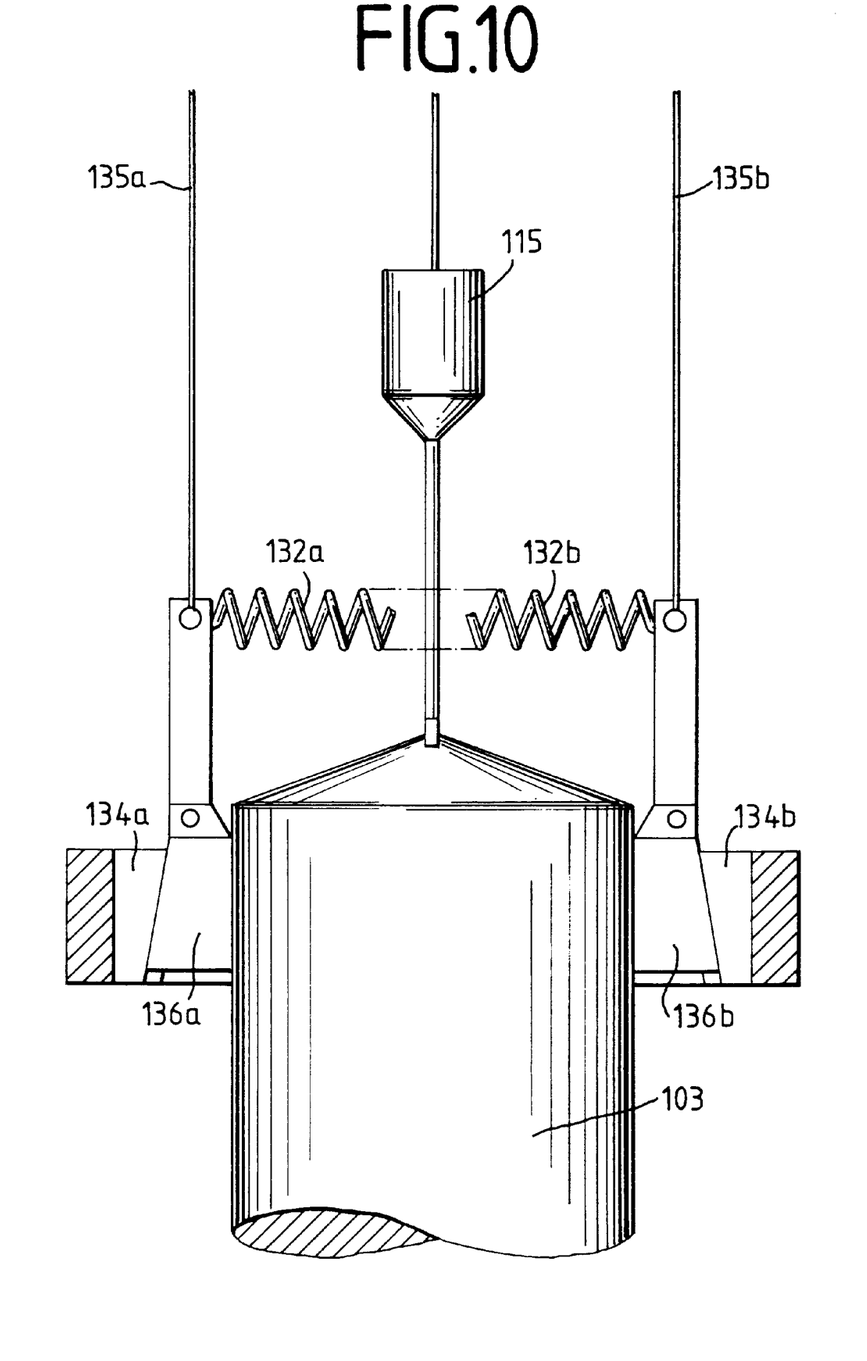
FIG. 10 shows a crystal drawing apparatus with a crystal holder according to an eighth exemplary embodiment.

In the case of the exemplary embodiment shown in FIG. 10, the actuating mechanism of the gripper has a design similar to that shown in FIGS. 7 and 8. In contrast to the sixth exemplary embodiment, however, jaws 136a, 136b are brought against the lateral surface of the crystal via ramps 134a, 134b, which are at a slant to the surface of the crystal. As a result, it is guaranteed that holding jaws 136a, 136b make gentle contact with crystal 103.

Figure 11:
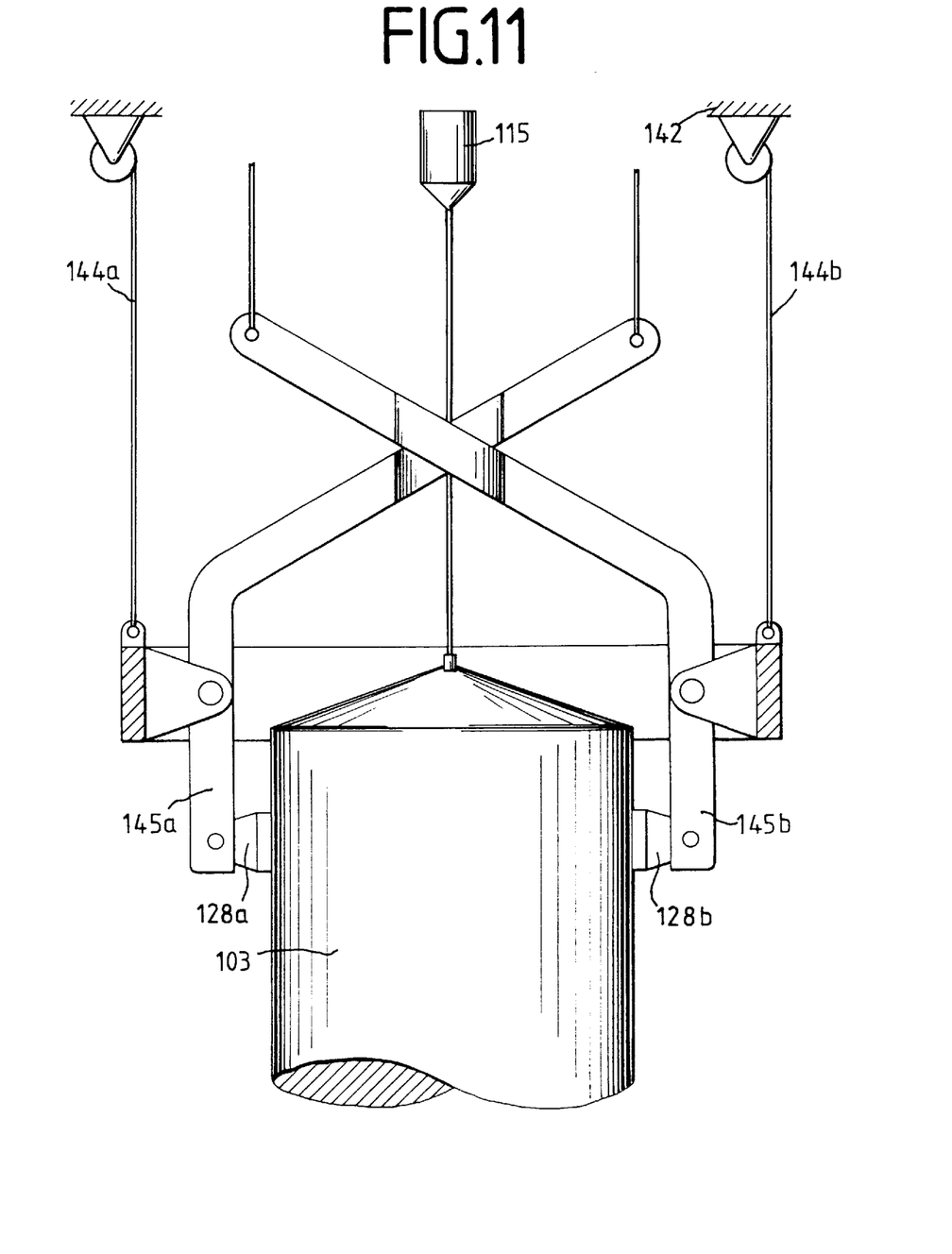
FIG. 11 shows a schematic diagram of a crystal drawing apparatus with a crystal holder according to a ninth exemplary embodiment.

In the exemplary embodiment shown in FIG. 11, grippers 145a, 145b have a design similar to that of the exemplary embodiment shown in FIG. 9. In contrast to the previous crystal holding devices, however, grippers 145a, 145b are attached additionally here to two belts (support belts) 144a, 144b, which are suspended from rotating table 142. It is possible for belts 144a, 144b either to be mounted permanently or to be provided additionally with a lifting drive. By means of this measure, the option exists that the gripper can be actuated independently of whatever axial position the crystal might be in.

Figure 12:
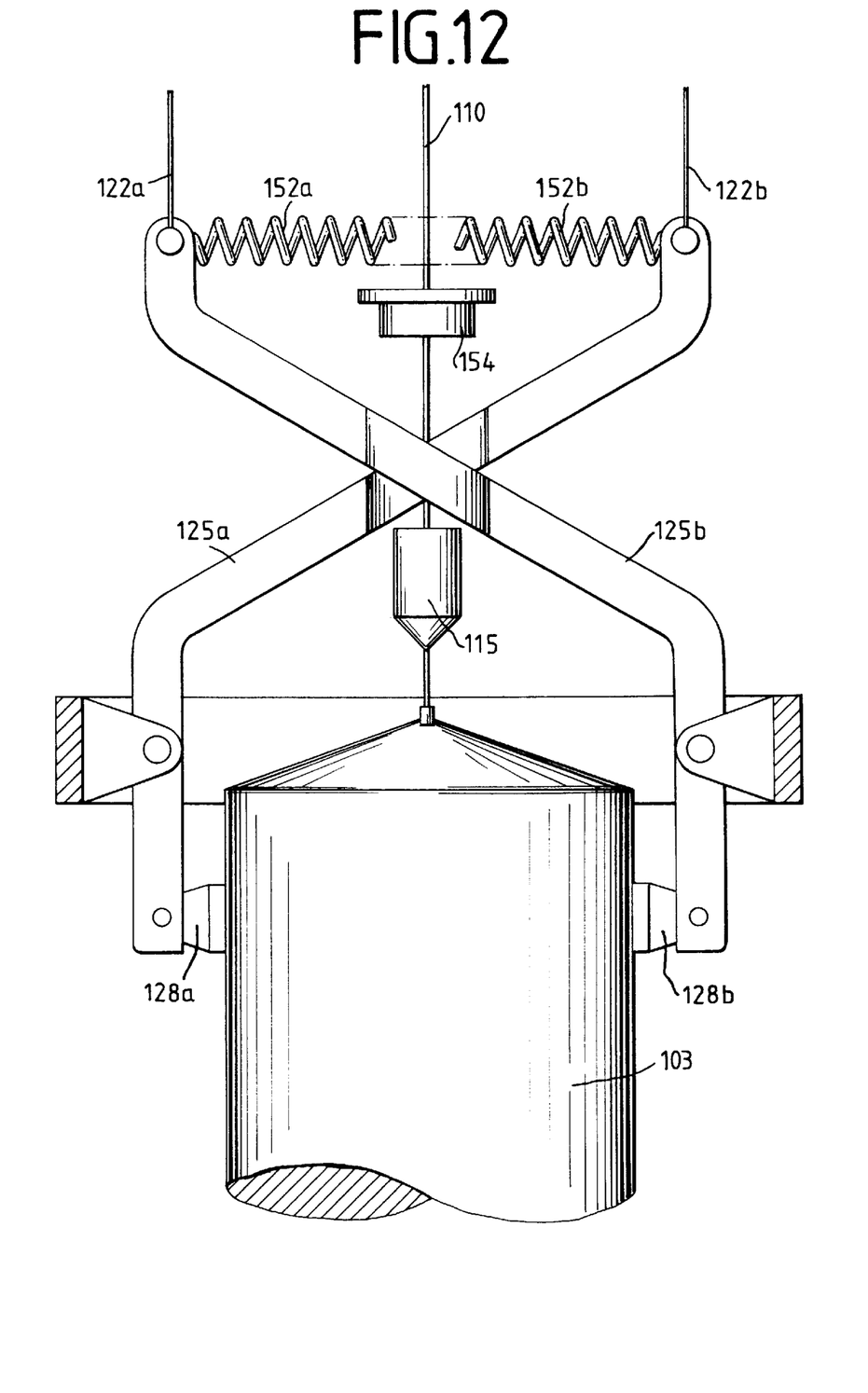
FIG. 12 shows a schematic diagram of a crystal drawing apparatus with integrated crystal holder according to a tenth exemplary embodiment.

In the exemplary embodiment shown in FIG. 12, the gripper is actuated by a trigger plate 154, which is attached to the cable and not directly to crystal 103. As a result, mechanical stress on the crystal body by contact with release spring 164a, 164b is avoided.

Figure 13:
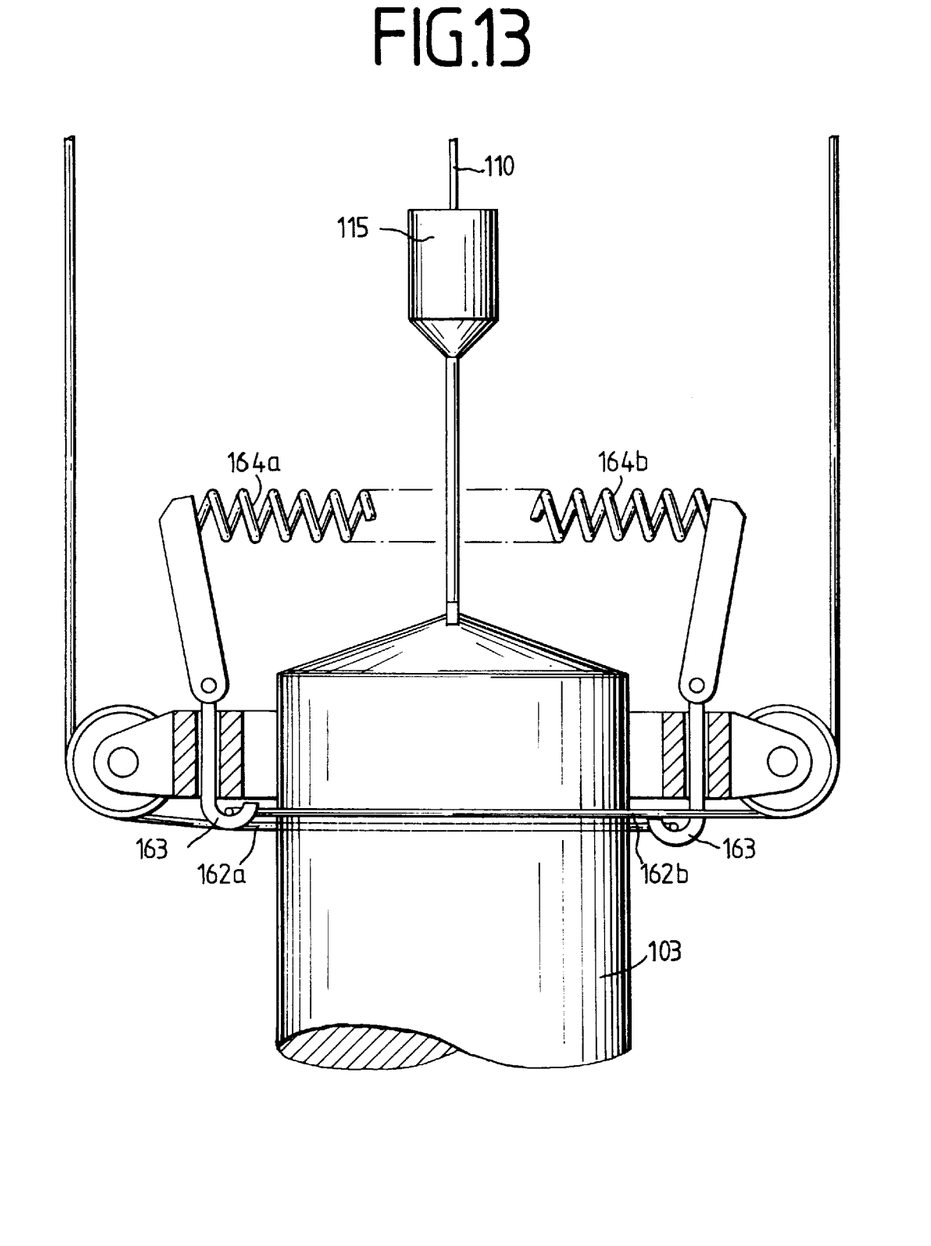
FIG. 13 shows a schematic side view of another exemplary embodiment of a crystal drawing apparatus with a crystal holder according to the invention.

The exemplary embodiment shown in FIG. 13 provides that the gripper hangs by its own weight in a wire yoke spring 163. After the release springs 164a, 164b have been contacted by crystal 103, wire yoke spring 163 is pulled up, as a result of which cable loops 162a, 162b open. The wire loops thus drop around crystal 103 and hold it firmly in a frictional manner.

What is claimed is:

1. Apparatus for the production of a single crystal drawn from a seed crystal by the Czochralski melt drawing method comprising:

a gripping device for gripping and holding a single crystal during the growth phase of said crystal, said gripping device comprising at least two gripping arms to hold the crystal, said gripping arms provided at intervals around the circumference of the crystal and arranged in opposing pairs, wherein each of said gripping arms has, at its lower end facing the crystal, a hold device, resting against the lateral surface of the grown crystal, by means of which the crystal can be gripped in a frictional manner and prevented from falling during said growth phase of the crystal and being movable in the direction parallel to that in which the crystal is grown, said gripping device capable of exerting a holding pressure on the crystal exclusively in the radial direction, such that a frictional resistance which exceeds the weight of the completely grown crystal is generated between the lateral surface of the crystal and said holding device, as a result of which the crystal is carried by said holding device under the effect of frictional engagement.

2. Apparatus according to claim 1, wherein after a shoulder has first been grown on the crystal, the diameter of the crystal remains constant over the crystal length grown thereafter.

3. Apparatus according to claim 1, further comprising release elements which, when contacted by a crystal or a carrier, produce the frictional connection between the holding device and a crystal.

4. Apparatus according to claim 3, wherein said release elements are release springs.

* * * * *